(12) United States Patent
Song et al.

(10) Patent No.: US 9,277,596 B2
(45) Date of Patent: Mar. 1, 2016

(54) TEMPERATURE CONTROL PIN, AND THE DEVICE AND METHOD FOR SUPPORTING SUBSTRATE IN UV CURING PROCESS

(71) Applicant: Shenzhen China Star Optoelectronics Technology Co., Ltd., Shenzhen, Guangdong (CN)

(72) Inventors: Tao Song, Shenzhen (CN); Guodong Zhao, Shenzhen (CN); Ming Liu, Shenzhen (CN); Tao Ma, Shenzhen (CN)

(73) Assignee: Shenzhen China Star Optoelectronics Technology Co., Ltd., Shenzhen, Guangdong (CN)

( * ) Notice: Subject to any disclaimer, the term of this patent is extended or adjusted under 35 U.S.C. 154(b) by 359 days.

(21) Appl. No.: 13/978,719

(22) PCT Filed: Jun. 24, 2013

(86) PCT No.: PCT/CN2013/077767
§ 371 (c)(1),
(2) Date: Jul. 9, 2013

(87) PCT Pub. No.: WO2014/201704
PCT Pub. Date: Dec. 24, 2014

(65) Prior Publication Data
US 2015/0037018 A1 Feb. 5, 2015

(30) Foreign Application Priority Data
Jun. 20, 2013 (CN) .......................... 2013 1 0246709

(51) Int. Cl.
*F26B 3/30* (2006.01)
*A47J 39/00* (2006.01)
(Continued)

(52) U.S. Cl.
CPC ........ *H05B 3/0047* (2013.01); *H01L 21/67103* (2013.01); *H01L 21/67109* (2013.01); *H01L21/6875* (2013.01); *H05B 1/0233* (2013.01); *H05B 3/02* (2013.01); *G02F 1/1313* (2013.01); *G02F 1/133788* (2013.01)

(58) Field of Classification Search
CPC ...... H05B 1/0233; H05B 3/02; H05B 3/0047; H01L 21/67103; H01L 21/67109; H01L 21/6875; G02F 1/1313; G02F 1/133788
USPC ............. 392/418; 165/61, 201, 206, 253–254
See application file for complete search history.

(56) References Cited

FOREIGN PATENT DOCUMENTS

CN 202224628 U 5/2012
CN 102745889 A 12/2012

OTHER PUBLICATIONS

Machine Translation of CN 102745889 A, Shenzen China Star Optoelectronics Technology Co LTD, Oct. 24, 2012.*

(Continued)

*Primary Examiner* — Dana Ross
*Assistant Examiner* — Lindsey C Teaters
(74) *Attorney, Agent, or Firm* — Andrew C. Cheng

(57) ABSTRACT

A temperature control pin, and the device and the method for supporting a substrate in the ultraviolet (UV) solidifying alignment process are disclosed. The temperature control pins includes a supporting pin for supporting a substrate, a heater being arranged within the supporting pin and is close to a top of the supporting pin, and a cooling system. The heater is controlled by the temperature control system to heat up the supporting pin. The cooling system is controlled by the temperature control system to cool down the supporting pin, and cooperatively operates with the heater to dynamically adjust the temperature of the supporting pins. When being heated, the temperature of the temperature control pins is adjusted by the temperature control system, and the substrate is heated uniformly such that the "Pin Mura" phenomenon is reduced or decreased.

17 Claims, 3 Drawing Sheets

(51) Int. Cl.
*F25B 29/00* (2006.01)
*H05B 3/00* (2006.01)
*H05B 1/02* (2006.01)
*H05B 3/02* (2006.01)
*H01L 21/67* (2006.01)
*H01L 21/687* (2006.01)
*G02F 1/13* (2006.01)
*G02F 1/1337* (2006.01)

(56) References Cited

OTHER PUBLICATIONS

Machine Translation of CN 202224628 U, Dalian Yaming Automotive Parts Co LTD, May 23, 2012.*

* cited by examiner

TEMPERATURE CONTROL PIN, AND THE DEVICE AND METHOD FOR SUPPORTING SUBSTRATE IN UV CURING PROCESS

BACKGROUND OF THE INVENTION

1. Field of the Invention

Embodiments of the present disclosure relate to liquid crystal display (LCD) technology, and more particularly to a temperature control pin, and the device and the method for supporting the substrate in the ultraviolet (UV) curing process.

2. Discussion of the Related Art

UV curing is a very important process during the manufacturing of the LCDs adopting HVA technology. After the liquid crystal cell is filled with the liquid crystal, an electrical field is applied to the glass substrate and then the UV rays are radiated on the liquid crystal. Polymerization reaction is then initiated and the alignment of the liquid crystal is achieved. Key factors of the above process include whether the UV rays are uniformly radiated, the electric field, and the temperature of the polymerization reaction. As shown in FIG. 1, a voltage pin 12 applies a voltage to the glass substrate 11. In order to achieve uniform UV radiation, a plurality of supporting pins 10 is adopted to support the glass substrate 11. However, as the supporting pins 10 are not heat-isolated, the substrate may be non-uniformly heated due to the contact between the supporting pins 10 and the glass substrate 11. Furthermore, the brightness of the LCD may also be non-uniform due to the supporting pins 10, which is commonly referred to as "Pin Mura."

In order to overcome the above "Pin Mura" issue, as shown in FIG. 2, the number of the supporting pins 20 is decreased. In addition, the supporting pins 20 are arranged to contact the non-display area. However, the substrate 21 may be bent while adopting such configuration. Furthermore, defective contact may happen when the voltage pin 22 applies the voltage to the substrate.

SUMMARY

In one aspect, a temperature control pin includes: a supporting pin for supporting a substrate; a heater being arranged within the supporting pin and is close to a top of the supporting pin, and the heater is controlled by the temperature control system to heat up the supporting pin; and a cooling system being controlled by the temperature control system to cool down the supporting pin, and cooperatively operates with the heater to dynamically adjust the temperature of the supporting pins.

Wherein the cooling system includes: a circulating tube entering a bottom of the supporting pin via an inlet hole, surrounding the top of the supporting pin, and then exiting a bottom of the supporting pin via an outlet hole; cooling water circulating within the circulating tube; and a control valve being arranged above a portion of the circulating tube that has not entered the inlet hole, and the control valve is controlled by the temperature control system so as to be turn on or off.

Wherein the supporting pin is made by metallic material.

Wherein the temperature control system includes: a detection system for detecting the temperature of the substrate and the supporting pin; and a control system for controlling the temperature of the supporting pin upon determining a comparison result of the temperature of the substrate and the supporting pin.

Wherein the detection system includes: a first temperature detector being arranged below the substrate and is spaced apart from the supporting pin in a certain distance so as to detect the temperature of the substrate; and a third temperature detector being arranged on the top of the supporting pin to detect the temperature of the top of the supporting pin.

Wherein the detection system further includes a second temperature detector being arranged below the substrate and is close to the supporting pin so as to detect the temperature of a proximity of the location of the supporting pin.

Wherein the first temperature detector and the second temperature detector are infrared thermometers, and the third temperature detector is a thermocouple thermometer.

Wherein the control system includes a heating control system and a cooling control system, the heating control system heats up the supporting pin upon detecting the temperature of the substrate is higher than the temperature of the top of the supporting pin, and the cooling control system cools down the supporting pin upon detecting the temperature of the substrate is lower than the temperature of the top of the supporting pin.

In another aspect, a device for supporting a substrate in the UV Curing process includes: a plurality of temperature control pins, each of the temperature control pin includes a supporting pin for supporting a substrate, a heater being arranged within the supporting pin, and a cooling system, the heater is close to a top of the supporting pin, and the heater is controlled by the temperature control system to heat up the supporting pin, the cooling system being controlled by the temperature control system to cool down the supporting pin and cooperatively operates with the heater to dynamically adjust the temperature of the supporting pins; and a temperature control system connects to the heater and the cooling system to independently control the temperature of the supporting pins so as to maintain the temperature of the substrate and the temperature control pins to be the same, and thus the substrate and proximity of the location of the supporting pins are uniformly heated.

Wherein the cooling system includes: a circulating tube entering a bottom of the supporting pin via an inlet hole, surrounding the top of the supporting pin, and then exiting a bottom of the supporting pin via an outlet hole; cooling water circulating within the circulating tube; and a control valve being arranged above a portion of the circulating tube that has not entered the inlet hole, and the control valve is controlled by the temperature control system so as to be turn on or off.

Wherein the supporting pin is made by metallic material.

Wherein the temperature control system includes: a detection system for detecting the temperature of the substrate and the supporting pin; and a control system for controlling the temperature of the supporting pin upon determining a comparison result of the temperature of the substrate and the supporting pin.

Wherein the detection system includes: a first temperature detector being arranged below the substrate and is spaced apart from the supporting pin in a certain distance so as to detect the temperature of the substrate; and a third temperature detector being arranged on the top of the supporting pin to detect the temperature of the top of the supporting pin.

Wherein the detection system further includes a second temperature detector being arranged below the substrate and is close to the supporting pin so as to detect the temperature of the proximity of the location of the supporting pin.

Wherein first temperature detector and the second temperature detector are infrared thermometers, and the third temperature detector is a thermocouple thermometer.

Wherein the control system includes a heating control system and a cooling control system, the heating control system heats up the supporting pin upon detecting the temperature of the substrate is higher than the temperature of the top of the supporting pin, and the cooling control system cools down the supporting pin upon detecting the temperature of the substrate is lower than the temperature of the top of the supporting pin.

In another aspect, a method for supporting a substrate in the ultraviolet (UV) solidifying alignment process includes: supporting the substrate by a plurality of temperature control pins; detecting and comparing the temperature of the substrate and the temperature control pins; and independently controlling the temperature of the temperature control pins according to a comparison result so as to maintain the temperature of the substrate and the temperature control pins to be the same, and uniformly heating up the substrate and a proximity of the location of the supporting pins such that the substrate is uniformly heated.

In view of the above, the temperature control pins, and the device and the method for supporting the substrate in the UV curing process keeps the temperature of the substrate and the temperature control pins to be the same by controlling the temperature of the temperature control pins. In addition, the locations of the temperature control pins and the proximity of the temperature control pins are uniformly heated such that the "Pin Mura" phenomenon is reduced. In the substrate alignment process, the number of the temperature control pins has not to be decreased. The substrate is prevented from being bent, and the contact efficiency is enhanced when the voltage is applied to the temperature control pins.

DETAILED DESCRIPTION OF THE EMBODIMENTS

Embodiments of the invention will now be described more fully hereinafter with reference to the accompanying drawings, in which embodiments of the invention are shown.

Figure 1:
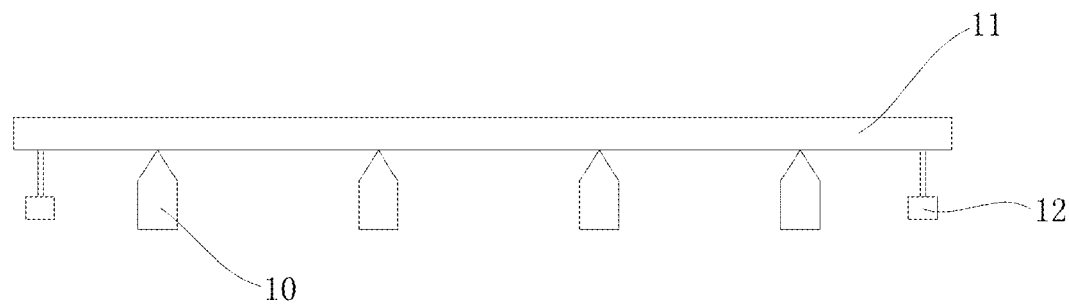
FIG. 1 is a schematic view of the conventional device for supporting the substrate in the UV curing process.
Figure 2:
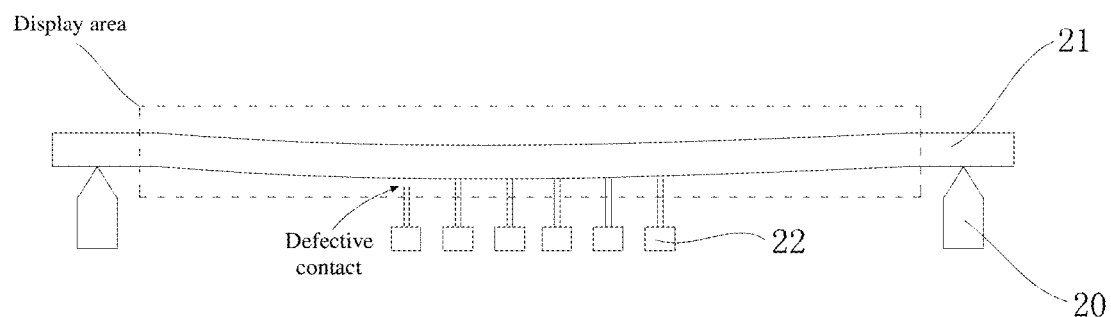
FIG. 2 is a schematic view illustrating the bent substrate due to the removal of supporting pins.
Figure 3:
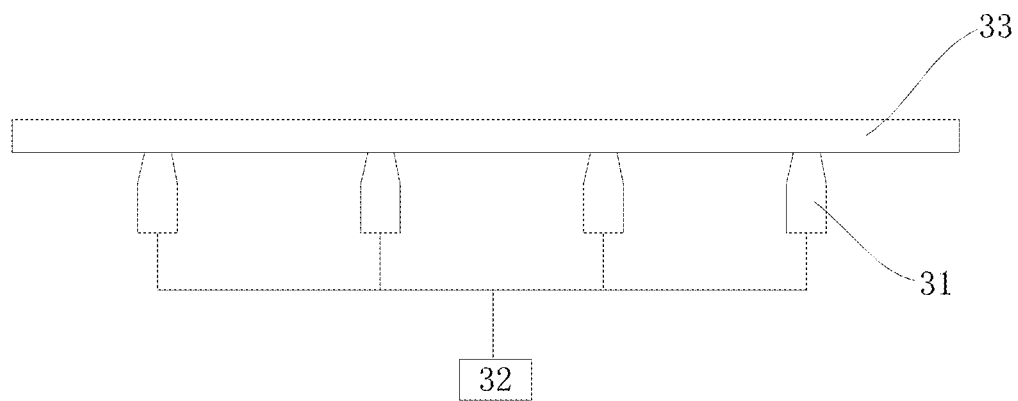
FIG. 3 is a schematic view of the device for supporting the substrate in the UV curing process in accordance with one embodiment.

FIG. 3 is a schematic view of the device for supporting the substrate in the UV curing process ("the supporting device") in accordance with one embodiment. As shown in FIG. 3, the supporting device includes a plurality of temperature control pins 31 and a temperature control system 32.

Specifically, the temperature control pins 31 are for supporting the substrate 33. Each temperature control pins 31 connects to the temperature control system 32 and is independently controlled by the temperature control system 32 such that the temperature of the temperature control pins 31 is the same with that of the substrate 33. In addition, the locations of the temperature control pins 31 and the proximity of the temperature control pins 31 are uniformly heated. When being heated, the temperature of the temperature control pins 31 is adjusted by the temperature control system 32, and the substrate 33 is heated uniformly such that the "Pin Mura" phenomenon is reduced.

Figure 4:
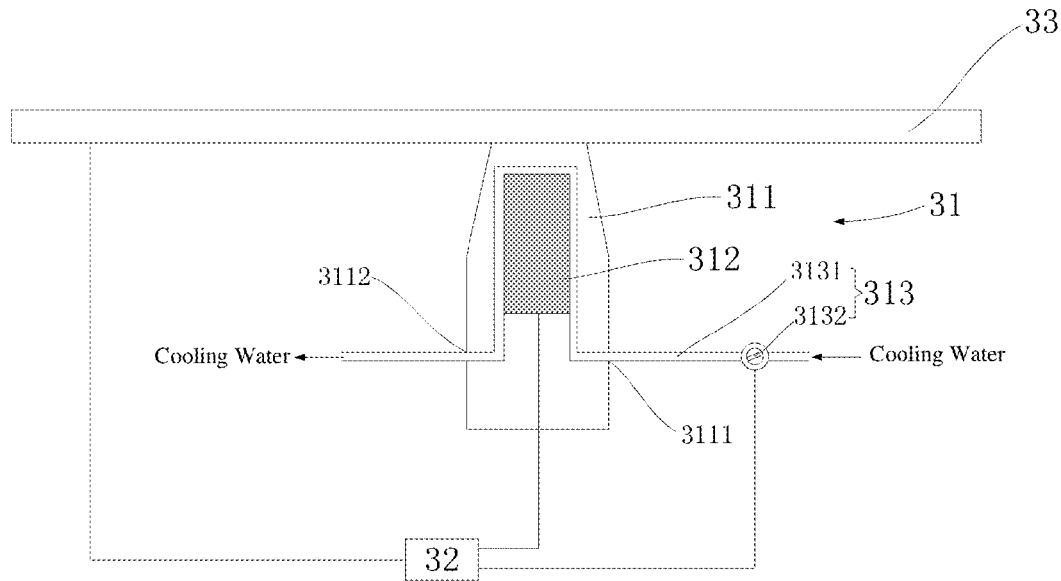
FIG. 4 is a schematic view of the temperature control pin and the cooling system thereof in accordance with one embodiment.

The structure of the temperature control pins 31 will be described hereinafter. FIG. 4 is a schematic view of the temperature control pin and the cooling system thereof in accordance with one embodiment. It is to be noted that only one temperature control pin 31 is taken as an example, and the structure of the temperature control pin 31 is enlarged for illustration.

As shown in FIG. 4, the temperature control pin 31 includes a supporting pin 311, a heater 312, and a cooling system 313.

The supporting pin 311 supports the substrate 33. The heater 312 is arranged within the supporting pin 311 and is close to a top of the supporting pin 311. The heater 312 is controlled by the temperature control system 32 to heat up the supporting pin 311. For example, the temperature control system 32 controls the heater 312 to heat up the supporting pin 311 upon detecting the temperature of the top of the supporting pin 311 is lower than that of the substrate 33. The cooling system 313 is controlled by the temperature control system 32. For example, the temperature control system 32 controls the cooling system 313 to cool down the supporting pin 311 upon detecting the temperature of the top of the supporting pin 311 is higher than that of the substrate 33. In this way, the temperature control system 32 dynamically control the heater 312 or the supporting pin 311 according to the temperature of the supporting pin 311 and the substrate 33. As such, the temperature of the substrate 33 is the same with that of the supporting pin 311. In addition, the locations of the supporting pin 311 and the proximity of the locations are uniformly heated.

As the supporting pin 311 needs to be highly sensitive to the temperature, the supporting pin 311 has to be made by heat-conductive material. In the embodiment, the supporting pin 311 may be made by metallic material, such as aluminum or cooper, or by heat-conductive alloy.

Furthermore, the cooling system 313 includes a circulating tube 3131, cooling water, and a control valve 3132. The circulating tube 3131 enters a bottom of the supporting pin 311 via an inlet hole 3111, surrounds the top of the supporting pin 311, and then exits a bottom of the supporting pin 311 via an outlet hole 3112. The cooling water circulates within the circulating tube 3131. The control valve 3132 is arranged above a portion of the circulating tube 3131 that has not entered the inlet hole 3111. The control valve 3132 connects to the temperature control system 32 and is controlled by the temperature control system 32.

Figure 5:
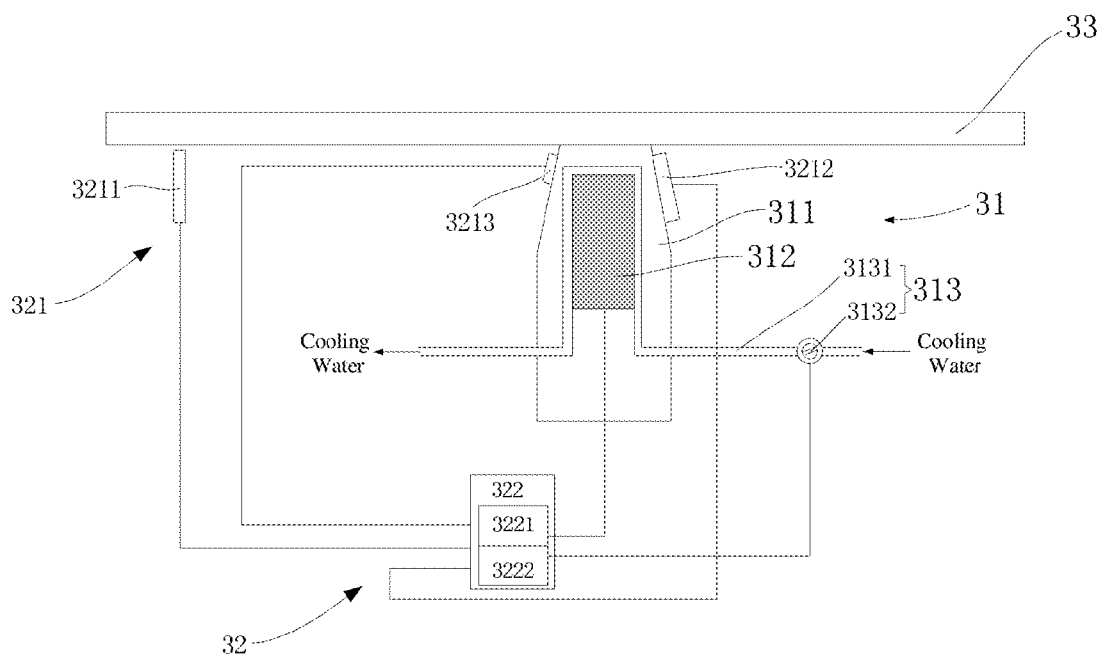
FIG. 5 is a schematic view of the temperature control system in accordance with one embodiment.

FIG. 5 is a schematic view of the temperature control system in accordance with one embodiment. The temperature control system 32 includes a detection system 321 and a control system 322.

The detection system 321 detects the temperature of the substrate 33 and the supporting pin 311. The control system 322 controls the temperature of the supporting pin 311 upon determining a comparison result of the temperature of the substrate 33 and the supporting pin 311. In order to avoid the interference from the temperature of the supporting pin 311, the detection system 321 is configured to detect the temperature of the proximity of the location of the supporting pin 311.

The detection system 321 further includes a first temperature detector 3211 and a third temperature detector 3213. The first temperature detector 3211 is arranged below the substrate 33 and is spaced apart from the supporting pin 311 in a certain distance. The third temperature detector 3213 is arranged on the top of the supporting pin 311 to detect the temperature of the top of the supporting pin 311.

The control system 322 includes a heating control system 3221 and a cooling control system 3222. The heating power and/or heating time of the heater 312 are controlled by the heating control system 3221 in accordance with the comparison result of the temperature of the substrate 33 and the supporting pin 311 such that the temperature of the supporting pin 311 is controlled. Also, the above comparison result is adopted to turn on or off the control valve 3132 by the cooling control system 3222. The control valve 3132 is controlled by controlling the amount of the cooling water. In this way, the temperature of the substrate 33 and the supporting pin 311 are controlled by the heating control system 3221 and the cooling control system 3222.

For example, when detecting that the temperature of the substrate 33 is higher than that of the top of the supporting pin 311 detected by the third temperature detector 3213, the heating control system 3221 heats up the supporting pin 311. When detecting that the temperature of the substrate 33 is lower than that of the top of the supporting pin 311 detected by the third temperature detector 3213, the heating control system 3221 cools down the supporting pin 311 by turning on the control valve 3132. In this way, the amount of the cooling water is increased, and thus the temperature of the supporting pin 311 is reduced.

In order to detect the temperature of the proximity of the location of the supporting pin 311, the detection system 321 further includes a second temperature detector 3212. The second temperature detector 3212 is arranged below the substrate 33 and is close to the supporting pin 311. Upon detecting that the temperature of the proximity of the location of the supporting pin 311 is higher than that of the top of the supporting pin 311 by the third temperature detector 3213, the heating control system 3221 heats up the supporting pin 311 by controlling the heating power and/or heating time. Upon detecting that the temperature of the proximity of the location of the supporting pin 311 is lower than that of the top of the supporting pin 311 by the third temperature detector 3213, the cooling control system 3222 cools down the supporting pin 311 by controlling the amount of the cooling water. As such, the substrate 33 and the proximity of the location of the supporting pins 311 are uniformly heated.

In the embodiment, preferably, the first temperature detector 3211 and the second temperature detector 3212 are infrared thermometers, and the third temperature detector 3213 is a thermocouple thermometer.

In the embodiment, the substrate 33 is a glass substrate.

Figure 6:
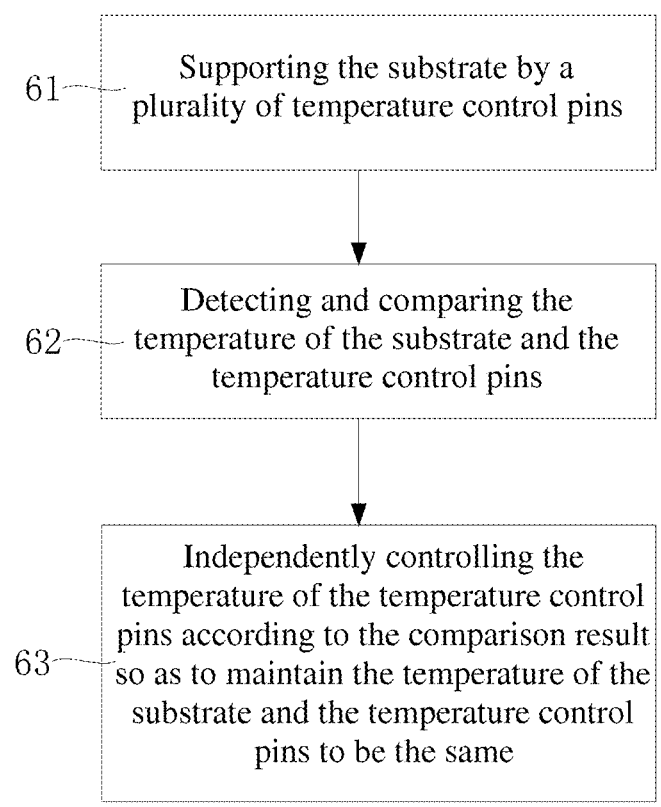
FIG. 6 is a flowchart illustrating the method of supporting the substrate in the UV curing process in accordance with one embodiment.

FIG. 6 is a flowchart illustrating the method of supporting the substrate in the UV curing process in accordance with one embodiment. The method includes the following steps. In step S61, a plurality of temperature control pins supports the substrate. In step S62, the temperature of the substrate and the temperature control pins are detected and compared. In step S63, the temperature of the temperature control pins are independently controlled according to the comparison result so as to maintain the temperature of the substrate and the temperature control pins to be the same. In addition, the substrate and the proximity of the location of the supporting pins are uniformly heated.

In view of the above, the temperature control pins, and the device and the method for supporting the substrate in the UV curing process keeps the temperature of the substrate and the temperature control pins to be the same by controlling the temperature of the temperature control pins. In addition, the locations of the temperature control pins and the proximity of the temperature control pins are uniformly heated such that the "Pin Mura" phenomenon is reduced. In the substrate alignment process, the number of the temperature control pins has not to be decreased. The substrate is prevented from being bent, and the contact efficiency is enhanced when the voltage is applied to the temperature control pins.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A temperature control pin, comprising:
   a supporting pin for supporting a substrate;
   a heater being arranged within the supporting pin and is close to a top of the supporting pin, and the heater is controlled by a temperature control system to heat up the supporting pin; and
   a cooling system being controlled by the temperature control system to cool down the supporting pin, and cooperatively operates with the heater to dynamically adjust the temperature of the supporting pin, the cooling system comprising a circulating tube entering a bottom of the supporting pin via an inlet hole, surrounding the top of the supporting pin, and then exiting the bottom of the supporting pin via an outlet hole, and cooling water circulating within the circulating tube.

2. The temperature control pin as claimed in claim 1, wherein the cooling system comprises:
   a control valve being arranged above a portion of the circulating tube that has not entered the inlet hole, and the control valve is controlled by the temperature control system so as to be turn on or off.

3. The temperature control pin as claimed in claim 1, wherein the supporting pin is made of metallic material.

4. The temperature control pin as claimed in claim 1, wherein the temperature control system comprises:
   a detection system for detecting the temperature of the substrate and the supporting pin; and
   a control system for controlling the temperature of the supporting pin upon determining a comparison result of the temperature of the substrate and the supporting pin.

5. The temperature control pin as claimed in claim 4, wherein the detection system comprises:
   a first temperature detector being arranged below the substrate and is spaced apart from the supporting pin in a certain distance so as to detect the temperature of the substrate; and
   a third temperature detector being arranged on the top of the supporting pin to detect the temperature of the top of the supporting pin.

6. The temperature control pin as claimed in claim 5, wherein the detection system further comprises a second temperature detector being arranged below the substrate and is close to the supporting pin so as to detect the temperature of a proximity of the location of the supporting pin.

7. The temperature control pin as claimed in claim 6, wherein the first temperature detector and the second temperature detector are infrared thermometers, and the third temperature detector is a thermocouple thermometer.

8. The temperature control pin as claimed in claim 4, wherein the control system comprises a heating control system and a cooling control system, the heating control system heats up the supporting pin upon detecting the temperature of the substrate is higher than the temperature of the top of the supporting pin, and the cooling control system cools down the supporting pin upon detecting the temperature of the substrate is lower than the temperature of the top of the supporting pin.

9. A device for supporting a substrate in the UV Curing process, comprising:
- a plurality of temperature control pins, each of the temperature control pins comprises a supporting pin for supporting a substrate, a heater being arranged within the supporting pin, and a cooling system, the heater is close to a top of the supporting pin, and the heater is controlled by a temperature control system to heat up the supporting pin, the cooling system being controlled by the temperature control system to cool down the supporting pin and cooperatively operates with the heater to dynamically adjust the temperature of the supporting pins, the cooling system comprising a circulating tube entering a bottom of the supporting pin via an inlet hole, surrounding the top of the supporting pin, and then exiting the bottom of the supporting pin via an outlet hole, and cooling water circulating within the circulating tube; and
- the temperature control system connects to the heater and the cooling system to independently control the temperature of the supporting pins so as to maintain the temperature of the substrate and the temperature control pins to be the same, and thus the substrate and proximity of the location of the supporting pins are uniformly heated.

10. The supporting device as claimed in claim 9, wherein the cooling system comprises:
- a control valve being arranged above a portion of the circulating tube that has not entered the inlet hole, and the control valve is controlled by the temperature control system so as to be turn on or off.

11. The supporting device as claimed in claim 9, wherein the supporting pin is made of metallic material.

12. The supporting device as claimed in claim 9, wherein the temperature control system comprises:
- a detection system for detecting the temperature of the substrate and the supporting pin; and
- a control system for controlling the temperature of the supporting pin upon determining a comparison result of the temperature of the substrate and the supporting pin.

13. The supporting device as claimed in claim 12, wherein the detection system comprises:
- a first temperature detector being arranged below the substrate and is spaced apart from the supporting pin in a certain distance so as to detect the temperature of the substrate; and
- a third temperature detector being arranged on the top of the supporting pin to detect the temperature of the top of the supporting pin.

14. The supporting device as claimed in claim 13, wherein the detection system further comprises a second temperature detector being arranged below the substrate and is close to the supporting pin so as to detect the temperature of the proximity of the location of the supporting pin.

15. The supporting device as claimed in claim 14, wherein first temperature detector and the second temperature detector are infrared thermometers, and the third temperature detector is a thermocouple thermometer.

16. The supporting device as claimed in claim 12, wherein the control system comprises a heating control system and a cooling control system, the heating control system heats up the supporting pin upon detecting the temperature of the substrate is higher than the temperature of the top of the supporting pin, and the cooling control system cools down the supporting pin upon detecting the temperature of the substrate is lower than the temperature of the top of the supporting pin.

17. A method for supporting a substrate in the ultraviolet (UV) solidifying alignment process, comprising:
- supporting the substrate by a plurality of temperature control pins;
- detecting and comparing the temperature of the substrate and the temperature control pins; and
- independently controlling the temperature of the temperature control pins according to a comparison result so as to maintain the temperature of the substrate and the temperature control pins to be the same by a cooling system comprising a circulating tube entering a bottom of the supporting pin via an inlet hole, surrounding the top of the supporting pin, and then exiting the bottom of the supporting pin via an outlet hole, and cooling water circulating within the circulating tube, and uniformly heating up the substrate and a proximity of the location of the supporting pins such that the substrate is uniformly heated.

* * * * *